United States Patent
Chang et al.

(10) Patent No.: US 8,242,485 B2
(45) Date of Patent: Aug. 14, 2012

(54) SOURCE/DRAIN TECHNOLOGY FOR THE CARBON NANO-TUBE/GRAPHENE CMOS WITH A SINGLE SELF-ALIGNED METAL SILICIDE PROCESS

(75) Inventors: Josephine B. Chang, Mahopac, NY (US); Christian Lavoie, Ossining, NY (US); Zhen Zhang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 12/762,832

(22) Filed: Apr. 19, 2010

(65) Prior Publication Data

US 2011/0253980 A1     Oct. 20, 2011

(51) Int. Cl.
*H01L 29/06* (2006.01)
*H01L 21/44* (2006.01)

(52) U.S. Cl. .......... 257/24; 257/E29.245; 257/E21.411; 257/E51.04; 438/682

(58) Field of Classification Search ............... 257/24, 257/E29.245, E21.411, 485, 280, E51.04; 438/151, 132, 180, 299, 630, 682, 721; 977/938
See application file for complete search history.

(56) References Cited

U.S. PATENT DOCUMENTS

| | | | |
|---|---|---|---|
| 4,248,688 A * | 2/1981 | Gartner et al. | 204/192.34 |
| 2008/0128760 A1* | 6/2008 | Jun et al. | 257/280 |

* cited by examiner

*Primary Examiner* — A. Sefer
*Assistant Examiner* — Nikolay Yushin
(74) *Attorney, Agent, or Firm* — Louis J. Percello; Michael J. Chang, LLC

(57) ABSTRACT

Electronic devices having carbon-based materials and techniques for making contact to carbon-based materials in electronic devices are provided. In one aspect, a device is provided having a carbon-based material; and at least one electrical contact to the carbon-based material comprising a metal silicide, germanide or germanosilicide. The carbon-based material can include graphene or carbon nano-tubes. The device can further include a segregation region, having an impurity, separating the carbon-based material from the metal silicide, germanide or germanosilicide, wherein the impurity has a work function that is different from a work function of the metal silicide, germanide or germanosilicide. A method for fabricating the device is also provided.

23 Claims, 8 Drawing Sheets

SOURCE/DRAIN TECHNOLOGY FOR THE CARBON NANO-TUBE/GRAPHENE CMOS WITH A SINGLE SELF-ALIGNED METAL SILICIDE PROCESS

FIELD OF THE INVENTION

The present invention relates to electronic devices having carbon-based materials, such as field-effect transistor (FET) devices, and techniques for the fabrication thereof, and more particularly, to techniques for making contact to carbon-based materials in electronic devices.

BACKGROUND OF THE INVENTION

The source/drain contacts of a carbon nano-tube/graphene device are Schottky contacts, which introduces two major challenges to the device fabrication. The first challenge is how to make a self-aligned metal source/drain process to minimize gate underlap so as to enhance gate control to the source/drain Schottky junctions. The other challenge is how to reduce contact resistance of the Schottky contact between the source/drain metal to the carbon nano-tube or graphene. Metal with the right work function is the key for the contact resistance. With conventional fabrication schemes, for example, one metal (typically palladium (Pd)) is used for p-channel field-effect transistors (PFETs) and another metal (for example aluminum (Al)) is used for n-channel field-effect transistors (NFETs). The conventional fabrication process is not self-aligned. The use of multiple metals in a given fabrication scheme, however, increases production complexity, time and thus overall costs.

Thus, techniques for fabricating carbon nano-tube/graphene devices that efficiently and effectively meet the above-stated challenges would be desirable.

SUMMARY OF THE INVENTION

The present invention provides electronic devices having carbon-based materials and techniques for making contact to carbon-based materials in electronic devices. In one aspect of the invention, a device is provided having a carbon-based material; and at least one electrical contact to the carbon-based material comprising a metal silicide, germanide or germanosilicide. The carbon-based material can include graphene or carbon nano-tubes. The device can further include a segregation region, having an impurity, separating the carbon-based material from the metal silicide, germanide or germanosilicide, wherein the impurity has a work function that is different from a work function of the metal silicide, germanide or germanosilicide. A method for fabricating the device is also provided.

A more complete understanding of the present invention, as well as further features and advantages of the present invention, will be obtained by reference to the following detailed description and drawings.

DETAILED DESCRIPTION OF PREFERRED EMBODIMENTS

Provided herein are devices containing carbon-based materials and methods for the fabrication thereof. FIGS. 1-5 illustrate a process for fabricating a device containing a carbon-based material and forming a contact to the carbon-based material. The process is generally applicable to a variety of different device configurations, and FIGS. 6-12 and 13-20 illustrate the present techniques in the context of two different field-effect transistor (FET) device configurations, respectively.

Figure 1:
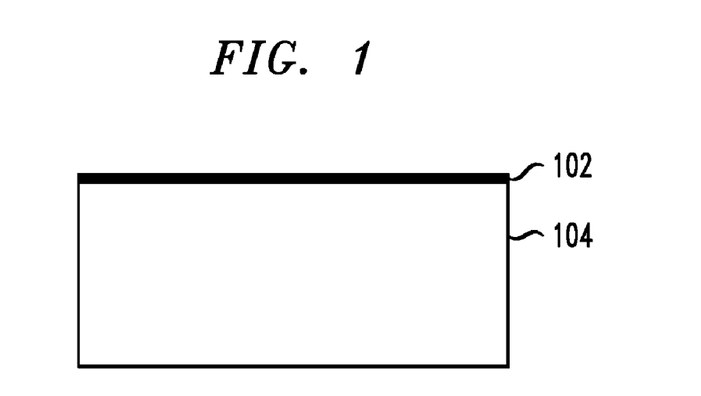
FIG. 1 is a cross-sectional diagram illustrating a carbon-based material having been placed over a substrate according to an embodiment of the present invention.

FIG. 1 is a cross-sectional diagram illustrating a carbon-based material 102, e.g., a carbon nano-tube or graphene material, having been placed over a substrate 104. The particular configuration of substrate 104 can vary depending on the given application at hand. By way of example only, when an electronic device, such as a FET, is being fabricated, the substrate can be a bulk silicon (Si) wafer in which shallow trench isolation (STI) regions are formed. This process is described by way of reference to an exemplary FET device fabrication below.

Any suitable techniques known in the art can be used to place carbon-based material 102 on substrate 104. By way of example only, when the carbon-based material comprises carbon nano-tubes, the carbon nano-tubes can be deposited on the substrate from a solution using a spin-on process. When the carbon-based material comprises graphene, the graphene can be deposited on the wafer using an exfoliation technique.

It is notable that carbon nano-tubes and graphene are only given as examples. Any suitable carbon-based material(s) can be used, and in fact the term "carbon-based material" as used herein is generally applicable to any material containing carbon, e.g., any material containing at least 90 percent (%) carbon, i.e., any material containing at least 50% carbon.

Figure 2:
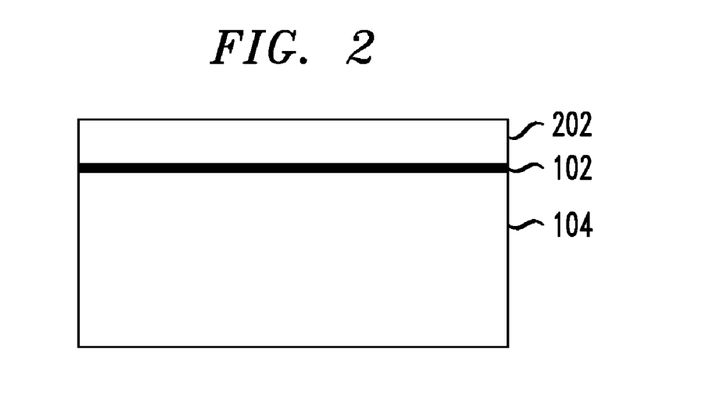
FIG. 2 is a cross-sectional diagram illustrating a semiconductor material having been selectively grown around the carbon-based material according to an embodiment of the present invention.

FIG. 2 is a cross-sectional diagram illustrating a semiconductor material 202 having been selectively grown around carbon-based material 102. According to an exemplary embodiment, semiconductor material 202 includes Si, germanium (Ge) or silicon germanium (SiGe) and is grown using a conventional epitaxy process, for example, using a suitable gaseous precursor.

Figure 3:
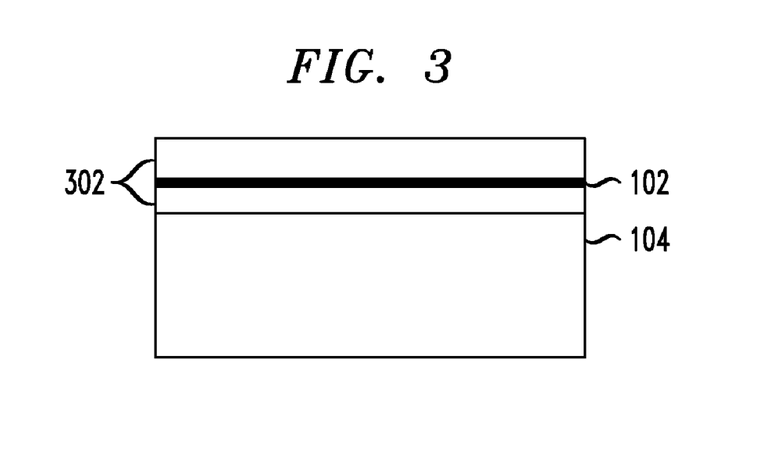
FIG. 3 is a cross-sectional diagram illustrating a metal silicide, germanide or germanosilicide region having been formed in the semiconductor material according to an embodiment of the present invention.

FIG. 3 is a cross-sectional diagram illustrating metal silicide, germanide or germanosilicide region 302 (depending on whether semiconductor material 202 is Si, Ge or SiGe, respectively) having been formed in semiconductor material 202. Region 302 can be formed using a maskless, self-aligned process. For example, region 302 can be formed by depositing a metal, such as nickel (Ni), over the device and then annealing the device to intersperse the metal ions with the Si, Ge or SiGe ions in semiconductor material 202. Since the silicide, germanide or germanosilicide will only be formed in the Si, Ge or SiGe regions of the device, i.e., semiconductor material 202, region 302 will be self-aligned to that area. Any unreacted metal can then be removed, e.g., by a suitable etching or grinding process. Alternatively, region 302 does not have to be formed using a self-aligning process. By way of example only, the metal can be blanket deposited over the device and patterned using a mask, i.e., a resist either directly or through the use of a hard mask, to remove metal from all but the areas over semiconductor material 202. The device can then be annealed to form the respective silicide, germanide or germanosilicide. According to the exemplary embodiment shown, for example, in FIG. 3, region 302 extends through semiconductor material 202 and into a portion of (e.g., Si) substrate 104, i.e., so as to surround carbon-based material 102 (i.e., keeping in mind that FIG. 3 is a cross-sectional view).

A single metal silicide, germanide or germanosilicide region is shown in FIG. 3 for illustrative purposes. According to the present techniques, this region will serve as an electrical contact to the carbon-based material. Therefore, depending on the configuration of the device (i.e., how many contacts to the carbon-based material are needed and in what locations) the number and/or placement of the contacts can be varied. Accordingly, multiple silicide, germanide or germanosilicide regions may be formed using the same process. Further, if multiple silicide, germanide or germanosilicide regions are employed, it is not required that each region contain the same metal, although use of the same metal might be advantageous. By way of example only, the above-described masking process may be used to selectively deposit one metal over one region of the semiconductor material and another metal over another region of the semiconductor material, and so on.

The process may be considered complete at this point with the metal silicide, germanide or germanosilicide electrical contact(s) having been formed to the carbon-based material. However, depending on the particular application (see, for example, the embodiments involving FET devices described below), it may be desirable to further tailor the properties of the contact(s), e.g., through the formation of a segregation region (see FIGS. 4 and 5, described below).

Figure 4:
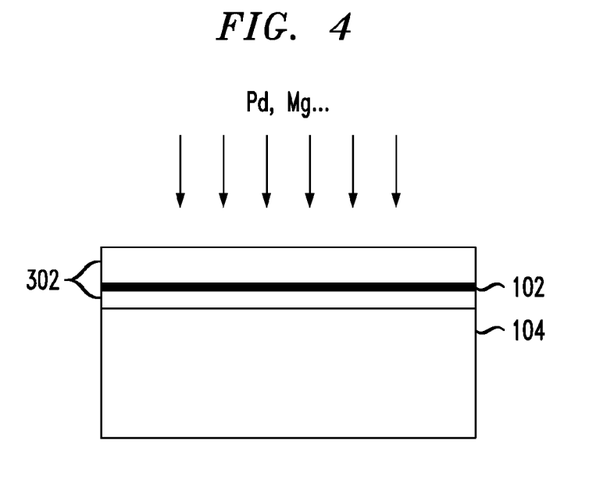
FIG. 4 is a diagram illustrating one or more impurities being implanted into the silicide, germanide or germanosilicide region according to an embodiment of the present invention.

FIG. 4 is a diagram illustrating one or more impurities being implanted into region 302. Since the impurity/impurities will be used to passivate the silicide, germanide or germanosilicide/channel interface (see below), the impurity/impurities should include an element that has a different work function than the respective silicide, germanide or germanosilicide (for example, a metal other than Ni with the suitable work function) and can make good contact with the carbon-based material of the channel. Suitable impurities that meet these criteria include, but are not limited to, metals such as palladium (Pd) and/or magnesium (Mg). Standard implantation techniques are known to those of skill in the art and thus are not described further herein.

Figure 5:
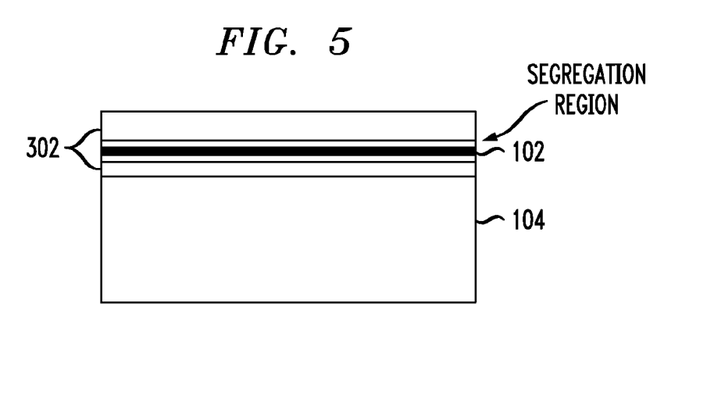
FIG. 5 is a diagram illustrating a segregation region having been formed between the carbon-based material and the silicide, germanide or germanosilicide region according to an embodiment of the present invention.

FIG. 5 is a diagram illustrating a segregation region having been formed between carbon-based material 102 and region 302. The segregation region is formed by diffusing the implanted impurity/impurities (see FIG. 4, described above) to the silicide, germanide or germanosilicide/carbon-based material interface using a low temperature rapid thermal anneal (RTA). The specific temperature of the thermal anneal will depend on the particular silicide, germanide or germanosilicide used. Typically, one will expect diffusion from about ⅔ of the melting point of the silicide, germanide or germanosilicide. For Ni silicide, for example, temperatures of from about 400° C. to about 650° C., i.e., from about 500° C. to about 600° C., may be employed. As described above, the implanted impurity/impurities can include metals such as Pd and/or Mg. As a result, in this example, the work function of the impurities in the segregation region is used to modify the Schottky barrier of the contact to be close to zero (i.e., less than about 100 milli-electron volts (meV)), or negative. Namely, the segregation region will serve to passivate the interface between the contact (metal silicide, germanide or germanosilicide region) and the carbon-based material. Thus, through the process described herein, the contact resistivity at this interface can be tailored based on the particular impurity or impurities used to form the segregation region. Namely, the impurity affects the apparent work function of the silicide, germanide or germanosilicide by engineering the interface (reconstruction). Because the silicide, germanide or germanosilicide and the Si have two different work functions, the bands are bending at the interface, and this generates a barrier for the carriers. The impurity (or impurities) prevents this bending from occurring (or reduces it) by generating a local field at the interface.

When multiple contacts (metal silicide, germanide or germanosilicide regions) are employed, see above, the segregation region associated with each contact can be individually tailored. For example, the impurity/impurities implanted into the segregation layer between one metal silicide, germanide or germanosilicide region and the carbon-based material can be different from the impurity/impurities implanted into the segregation regions of the other metal silicide, germanide or germanosilicide contact(s), irrespective of whether or not the contacts are the same (i.e., contain the same metal(s)) as one another. Therefore, the present techniques offer a wide variety of options to tailor the properties of the contacts for many different applications.

As highlighted above, the present techniques will now be described in the context of the fabrication of two different FET device configurations by way of reference to FIGS. 6-12 and FIGS. 13-20, respectively. Both processes employ a self-aligned metal silicide, germanide or germanosilicide source/drain process and a single metal for the silicide, germanide or germanosilicide of both p-channel FETs and n-channel FETs. Each methodology will now be described in detail.

Figure 6:
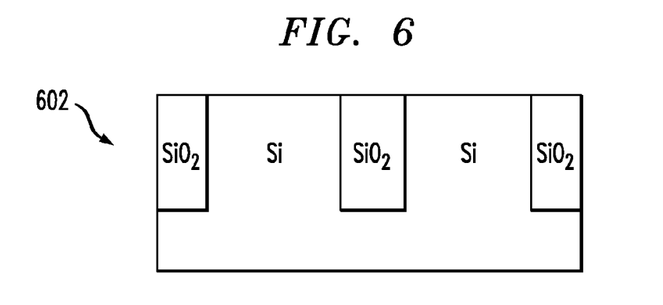
FIG. 6 is a cross-sectional diagram illustrating a starting structure for fabrication of a transistor device with shallow trench isolation (STI) regions having been formed on a wafer according to an embodiment of the present invention.

FIG. 6 is a cross-sectional diagram illustrating shallow trench isolation (STI) having been performed on a Si, Ge or SiGe wafer 602. STI techniques are known to those of skill in the art. In general, however, a wafer (e.g., a bulk Si wafer) is provided. Trenches are patterned into the wafer and filled with a dielectric material(s), such as silicon dioxide ($SiO_2$). Any excess $SiO_2$ can be removed, for example, by chemical-mechanical polishing (CMP).

Figure 7:
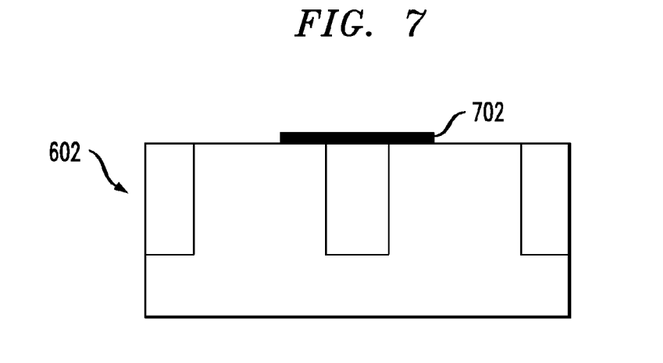
FIG. 7 is a cross-sectional diagram illustrating a carbon-based material having been placed over the STI regions so as to form a channel of the device according to an embodiment of the present invention.

FIG. 7 is a cross-sectional diagram illustrating a carbon-based material, e.g., carbon nano-tube or graphene, having been placed over the STI regions so as to form a channel 702 of the device. Any suitable techniques known in the art can be used to form the carbon-based channel (e.g., a spin-on process for carbon nano-tubes or exfoliation for graphene, see above). It is notable that any other suitable carbon-based material(s) can be used to form the channel of the device.

Figure 8:
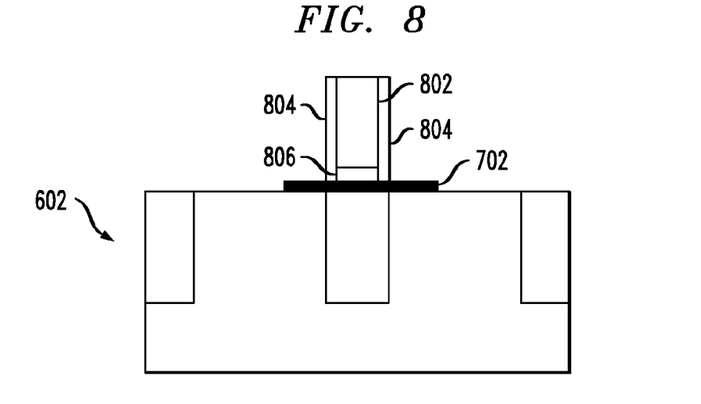
FIG. 8 is a cross-sectional diagram illustrating a gate stack having been formed over the channel and spacers having been formed adjacent to opposite sides of the gate stack according to an embodiment of the present invention.

FIG. 8 is a cross-sectional diagram illustrating a gate stack 802 having been formed over channel 702 and spacers 804 having been formed adjacent to opposite sides of gate stack 802. As shown in FIG. 8, gate stack 802 is separated from channel 702 by a gate dielectric layer 806. Gate stack 802 can be made up of any suitable gate material(s), including, but not limited to poly-silicon (poly-Si). Gate dielectric layer 806 can include any suitable gate dielectric material(s) including, but not limited to, $SiO_2$. Spacers 804 can include any suitable spacer material(s), including but not limited to, a nitride spacer material. Gate stack 802 and spacers 804 can be formed using conventional techniques, such as deposition and patterning processes known to those of skill in the art.

Figure 9:
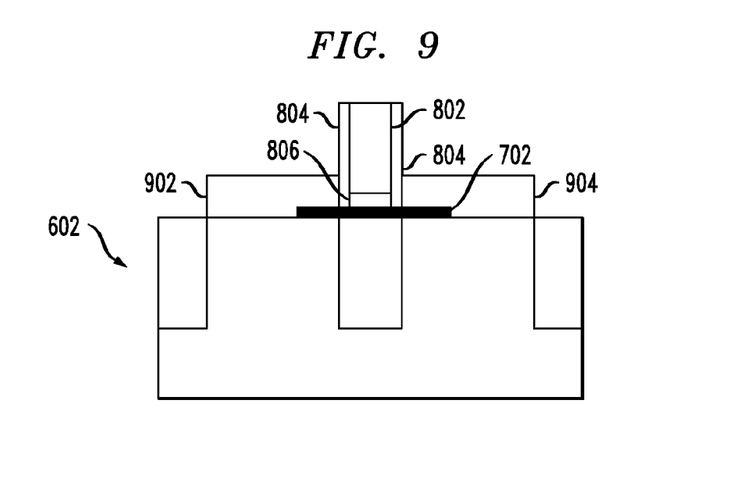
FIG. 9 is a cross-sectional diagram illustrating epitaxial regions having been formed in source and drain regions of the device according to an embodiment of the present invention.

FIG. 9 is a cross-sectional diagram illustrating a semiconductor material having been selectively grown in regions 902 and 904 which will serve as source and drain regions of the device. The semiconductor material in regions 902 and 904 surrounds channel 702 on opposite sides of gate stack 802. As described above, the semiconductor material can include Si, Ge or SiGe and can be grown using a conventional epitaxy process, for example, using a suitable gaseous precursor.

Figure 10:
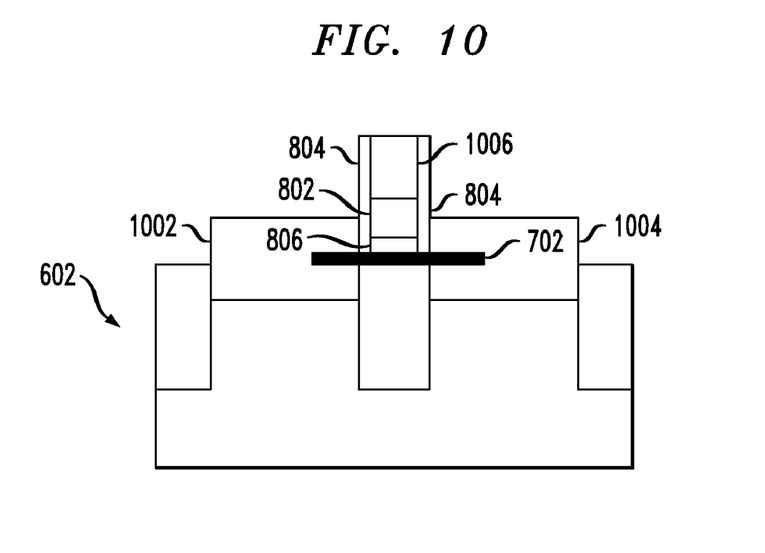
FIG. 10 is a cross-sectional diagram illustrating self-aligned metal silicide, germanide or germanosilicide regions having been formed in the source and drain regions according to an embodiment of the present invention.

FIG. 10 is a cross-sectional diagram illustrating self-aligned metal silicide, germanide or germanosilicide regions 1002 and 1004 (depending on whether the semiconductor material in regions 902 and 904 is Si, Ge or SiGe, respectively) having been formed in the source and drain regions, respectively. As shown in FIG. 10, a self-aligned silicide region 1006 has also been formed in the gate stack. According to an exemplary embodiment, regions 1002, 1004 and 1006 are formed by depositing a metal, such as Ni, over the device and then annealing the device to intersperse the metal ions with the Si, Ge or SiGe ions in regions 902 and 904 and with the Si in gate stack 802. Since the silicide will only be formed in the Si, Ge or SiGe regions of the device, i.e., (semiconductor material) regions 902 and 904 and in gate stack 802, regions 1002, 1004 and 1006 are self-aligned to those areas. According to an exemplary embodiment, a maskless process is used to form regions 1002, 1004 and 1006. Specifically, the metal (e.g., Ni) is blanket deposited over the device, the device is annealed to form the respective silicide, germanide or germanosilicide and then any unreacted metal is removed, e.g., by a suitable etching or grinding process.

Alternatively, the silicide, germanide or germanosilicide does not have to be formed using a self-aligning process (i.e., a mask may be employed). By way of example only, the metal can be blanket deposited over the device and patterned using a mask, i.e., a resist either directly or through the use of a hard mask, to remove metal from all but the areas over regions 902 and 904 and gate stack 802. The device can then be annealed to form the respective silicide, germanide or germanosilicide. According to the exemplary embodiment shown, for example, in FIG. 10, regions 1002 and 1004 extend through (semiconductor material) regions 902 and 904 and into a portion of wafer 602, i.e., so as to surround the ends of channel 702 (i.e., keeping in mind that FIG. 10 is a cross-sectional view) with the ends of channel 702 surrounded by regions 1002 and 1004 becoming part of the source and drain regions of the device.

One advantage of the present techniques is that a single metal (e.g., Ni) can be used in the silicide, germanide or germanosilicide process for both n-channel and p-channel FETs, since adjustments to the contacts can be made at the level of the segregation region (see below). While this single metal configuration can greatly streamline the fabrication process, as was described above it is not a requirement, and different metal silicides, germanides or germanosilicides (i.e., using different metals) can be formed in different regions of the device if so desired.

The particular parameters that are employed to form the silicide, germanide or germanosilicide regions, including the temperature and duration of the anneal, can vary depending on the specific requirements of the device and can be determined by one of skill in the art. It is notable, however, that the temperatures employed during this annealing process are significantly lower than that which would result in any significant amount of the carbon-based channel 702 being consumed.

Further, according to the exemplary embodiment shown in FIG. 10, silicide region 1006 only extends part of the way through gate stack 802, i.e., gate stack 802 is not fully silicided. The depth of silicide formation in the gate stack, for example, can be controlled by the amount of the metal deposited, the temperature and/or the duration of the anneal. Alternatively, gate stack 802 could be fully silicided (FUSI) if desired.

Regions 1002 and 1004 serve as electrical contacts to the carbon-based channel, and in this particular embodiment will serve as the source and drain regions of the device. Advantageously, the source and drain regions formed as described herein will not underlap the gate stack, which enhances gate control as described above. Further, as a result of this process the ends of channel 702 will be buried in a metal silicide, germanide or germanosilicide (e.g., nickel silicide (NiSi)), which will permit by way of the remaining steps of the process the contact resistivity at the silicide, germanide or germanosilicide/channel interface to be tailored using an implanted impurity or impurities.

The process may be considered complete at this point with the metal silicide, germanide or germanosilicide source and drain regions (electrical contacts) having been formed to the carbon-based channel. However, further tailoring of the contacts, for example, to configure the device as an n-channel FET or a p-channel FET, e.g., through the formation of a segregation region, may be desirable (see FIGS. 11 and 12, described below).

Figure 11:
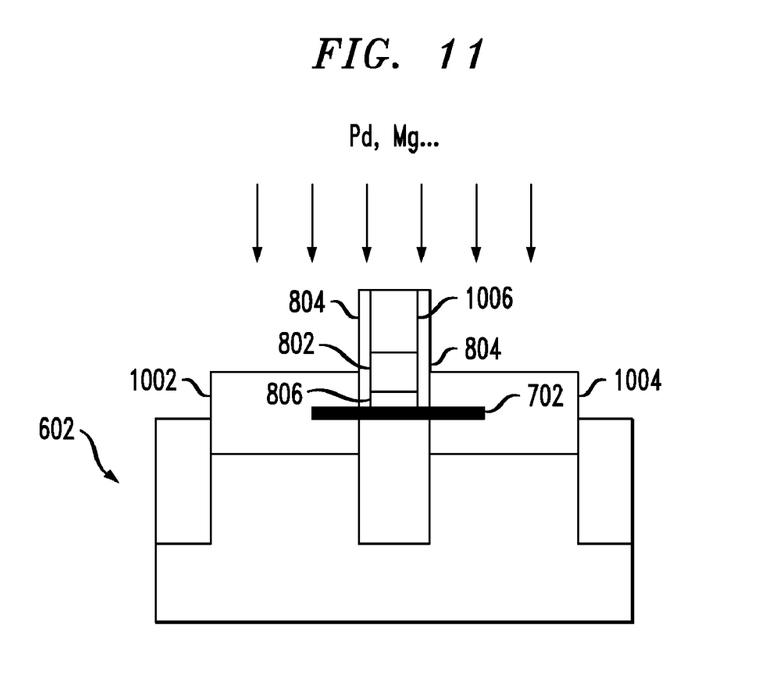
FIG. 11 is a cross-sectional diagram illustrating one or more impurities being implanted into the silicide, germanide or germanosilicide regions according to an embodiment of the present invention.

FIG. 11 is a cross-sectional diagram illustrating one or more impurities being implanted into regions 1002, 1004 and 1006. Since the impurity/impurities will be used to passivate the silicide, germanide or germanosilicide/channel interface, the impurity/impurities should include an element that has a different work function than the respective silicide, germanide or germanosilicide (for example, a metal other than Ni with the suitable work function) and can make good contact with the carbon-based material of the channel. Suitable impurities that meet these criteria include, but are not limited to, metals such as Pd and/or Mg.

Figure 12:
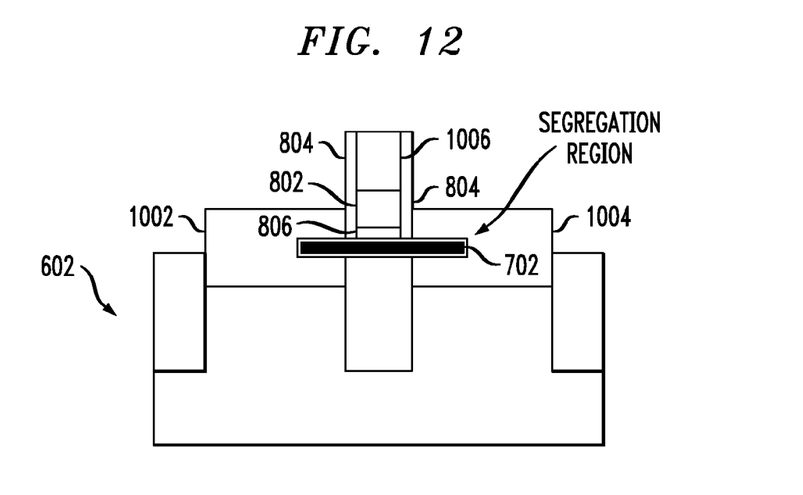
FIG. 12 is a cross-sectional diagram illustrating a segregation region having been formed between the channel and the (silicide, germanide or germanosilicide) source and drain regions according to an embodiment of the present invention.

FIG. 12 is a cross-sectional diagram illustrating a segregation region having been formed between channel 702 and regions 1002 and 1004. The segregation region is formed by diffusing the implanted impurity/impurities (see FIG. 11, described above) to the silicide, germanide or germanosilicide/channel interface using a low temperature rapid thermal anneal (RTA) (the temperature of which depends on the silicide, germanide or germanosilicide used, e.g., for Ni silicide temperatures of from about 400° C. to about 650° C., i.e., from about 500° C. to about 600° C., may be employed, see above). As a result, the work function of the impurities in the segregation region is used to modify the Schottky barrier of the contact to be close to zero (i.e., less than about 100 meV), or negative. Namely, the segregation layer will serve to passivate the silicide, germanide or germanosilicide/channel interface. Thus, through the process described herein, the contact resistivity at the silicide, germanide or germanosilicide/channel interface can be tailored based on the particular impurity or impurities used to form the segregation layer.

Figure 13:
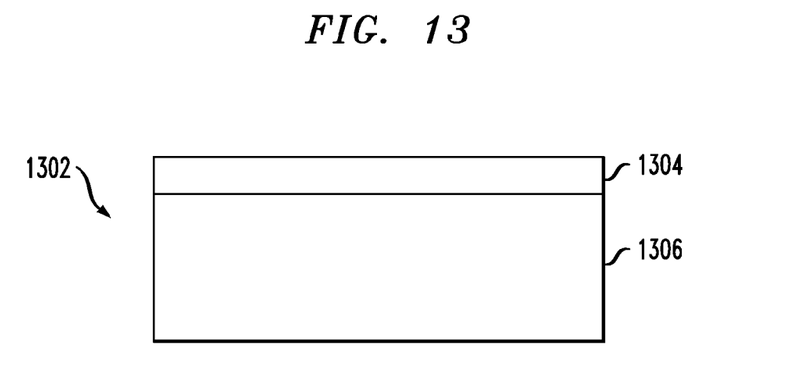
FIG. 13 is a cross-sectional diagram illustrating an oxidized substrate which is a starting structure for fabrication of a transistor device according to an embodiment of the present invention.

An alternate FET device fabrication process which employs the same principles of a self-aligned metal silicide, germanide or germanosilicide process to form source and drain regions and a single metal(s) for PFETs and NFETs will now be presented. FIG. 13 is a cross-sectional diagram illustrating an oxidized Si, Ge or SiGe substrate 1302, which is a starting structure for the process. By way of example only, oxidized substrate 1302 can include a $SiO_2$ layer 1304 over a Si, Ge or SiGe wafer 1306.

Figure 14:
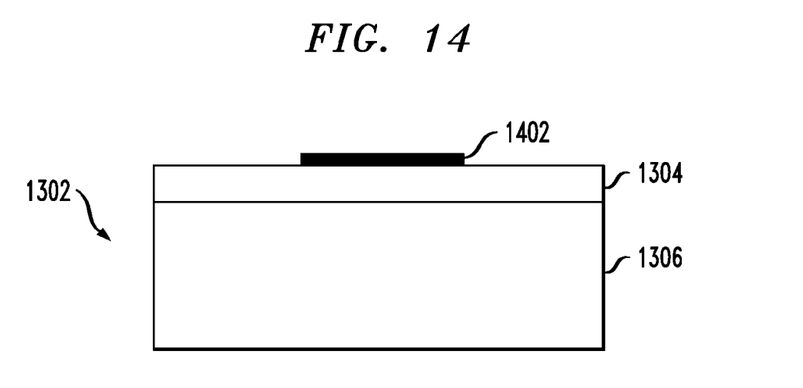
FIG. 14 is a cross-sectional diagram illustrating a carbon-based material having been placed over the oxidized substrate so as to form a channel of the device according to an embodiment of the present invention.

FIG. 14 is a cross-sectional diagram illustrating a carbon-based material, e.g., carbon nano-tube or graphene, having been placed over oxidized substrate 1302 so as to form a channel 1402 of the device. Any suitable techniques known in the art can be used to form the carbon-based channel (e.g., a spin-on process for carbon nano-tubes or exfoliation for graphene, see above). It is notable that any other suitable carbon-based material(s) can be used to form the channel of the device.

Figure 15:
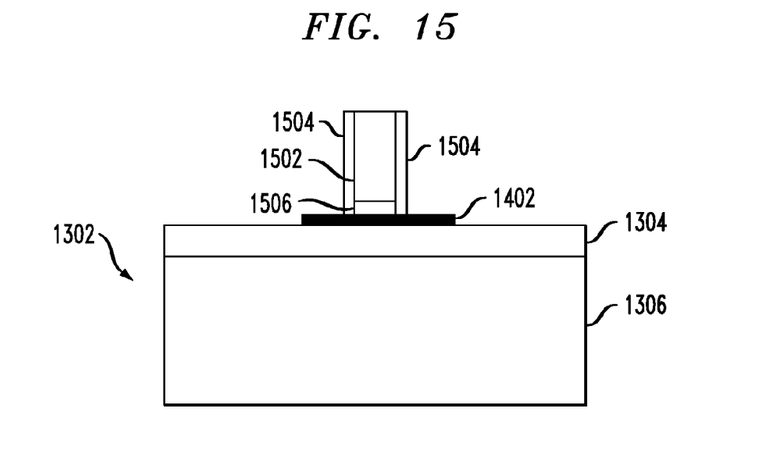
FIG. 15 is a cross-sectional diagram illustrating a gate stack having been formed over the channel and spacers having been formed adjacent to opposite sides of the gate stack according to an embodiment of the present invention.

FIG. 15 is a cross-sectional diagram illustrating a gate stack 1502 having been formed over channel 1402 and spacers 1504 having been formed adjacent to opposite sides of gate stack 1502. As shown in FIG. 15, gate stack 1502 is separated from channel 1402 by a gate dielectric layer 1506. Gate stack 1502 can be made up of any suitable gate material(s), including, but not limited to poly-Si. Gate dielectric layer 1506 can include any suitable gate dielectric material(s) including, but not limited to, $SiO_2$. Spacers 1504 can include any suitable spacer material(s), including but not limited to, a nitride spacer material. Gate stack 1502 and spacers 1504 can be formed using conventional techniques, such as deposition and patterning processes known to those of skill in the art.

Figure 16:
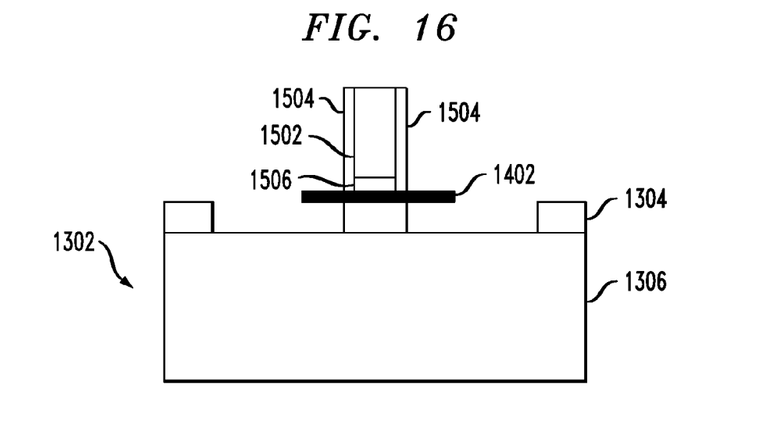
FIG. 16 is a cross-sectional diagram illustrating silicon (Si), germanium (Ge) or silicon germanium (SiGe) portions of the oxidized substrate having been exposed in source and drain regions of the device according to an embodiment of the present invention.

FIG. 16 is a cross-sectional diagram illustrating Si, Ge or SiGe portions of oxidized substrate 1302 having been exposed in source and drain regions of the device. Using the exemplary substrate configuration described in conjunction with the description of FIG. 13 above as an example, portions of $SiO_2$ layer 1304 can be selectively removed (in the source and drain regions of the device) using either a wet or dry etch to expose wafer 1306 thereunder. As shown in FIG. 16, as a result of this process, the ends of channel 1402 now extend over the exposed portions of wafer 1306.

Figure 17:
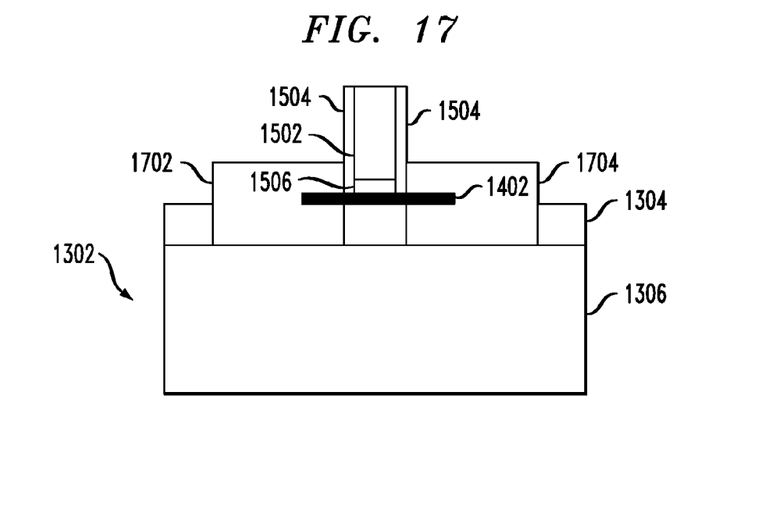
FIG. 17 is a cross-sectional diagram illustrating epitaxial regions having been formed in the source and drain regions of the device according to an embodiment of the present invention.

FIG. 17 is a cross-sectional diagram illustrating a semiconductor material having been selectively grown in regions 1702 and 1704 which will serve as source and drain regions of the device. As described above, the semiconductor material can include Si, Ge or SiGe and can be grown using a conventional epitaxy process, for example, using a suitable gaseous precursor. For example, in the exemplary embodiment shown illustrated in FIG. 17, regions 1702 and 1704 are grown up from the exposed portions of wafer 1306 (see FIG. 16, described above) using an epitaxy process and surround channel 1402 on opposite sides of gate stack 1502.

Figure 18:
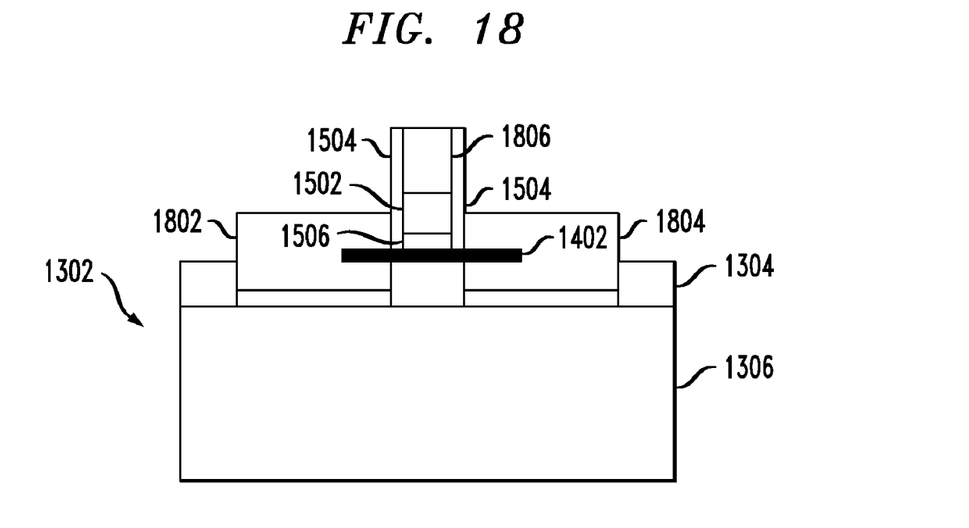
FIG. 18 is a cross-sectional diagram illustrating self-aligned metal silicide, germanide or germanosilicide regions having been formed in the source and drain regions according to an embodiment of the present invention.

FIG. 18 is a cross-sectional diagram illustrating self-aligned metal silicide, germanide or germanosilicide regions 1802 and 1804 (depending on whether the semiconductor material in regions 1702 and 1704 is Si, Ge or SiGe, respectively) having been formed in the source and drain regions, respectively. As shown in FIG. 18, a self-aligned silicide region 1806 has also been formed in the gate stack. According to an exemplary embodiment, regions 1802, 1804 and 1806 are formed by depositing a metal, such as Ni, over the device and then annealing the device to intersperse the metal ions with the Si, Ge or SiGe ions in regions 1702 and 1704 and with the Si in gate stack 1502. Since the silicide, germanide or germanosilicide will only be formed in the Si, Ge or SiGe regions of the device, i.e., (semiconductor material) regions 1702 and 1704 and in gate stack 1502, regions 1802, 1804 and 1806 are self-aligned to those areas. According to an exemplary embodiment, a maskless silicide, germanide or germanosilicide process is used to form regions 1802, 1804 and 1806. Specifically, the metal (e.g., Ni) is blanket deposited over the device, the device is annealed to form the respective silicide, germanide or germanosilicide and then any unreacted metal is removed, e.g., by a suitable etching or grinding process.

Alternatively, the silicide, germanide or germanosilicide does not have to be formed using a self-aligning process (i.e., a mask may be employed). By way of example only, the metal can be blanket deposited over the device and patterned using a mask, i.e., a resist either directly or through the use of a hard mask, to remove metal from all but the areas over regions 1702 and 1704 and gate stack 1502. The device can then be annealed to form the respective silicide, germanide or germanosilicide. As shown in FIG. 18, for example, regions 1802 and 1804 surround the ends of channel 1402 (i.e., keeping in mind that FIG. 18 is a cross-sectional view) with the ends of channel 1402 surrounded by regions 1802 and 1804 becoming part of the source and drain regions of the device.

As highlighted above, one advantage of the present techniques is that a single metal (e.g., Ni) can be used in the silicide, germanide or germanosilicide process for both n-channel and p-channel FETs, since adjustments to the contacts can be made at the level of the segregation region (see below). While this single metal configuration can greatly streamline the fabrication process, as was described above it is not a requirement, and different metal silicides, germanides or germanosilicides (e.g., using different metals) can be formed in different regions of the device if so desired.

The particular parameters that are employed to form the silicide, germanide or germanosilicide regions, including the temperature and duration of the anneal, can vary depending on the specific requirements of the device and can be determined by one of skill in the art. It is notable, however, that the temperatures employed during this annealing process are significantly lower than that which would result in any significant amount of the carbon-based channel 1402 being consumed.

Further, according to the exemplary embodiment shown in FIG. 18, silicide region 1806 only extends part of the way through gate stack 1502, i.e., gate stack 1502 is not fully silicided. The depth of silicide formation in the gate stack, for example, can be controlled by the amount of the metal deposited, the temperature and/or the duration of the anneal. Alternatively, gate stack 1502 could be fully silicided (FUSI) if desired.

Regions 1802 and 1804 serve as electrical contacts to the carbon-based channel, and in this particular embodiment will serve as the source and drain regions of the device. Advantageously, the source and drain regions formed as described herein will not underlap the gate stack, which enhances gate control as described above. Further, as a result of this process the ends of channel 1402 will be buried in a metal silicide, germanide or germanosilicide (e.g., nickel silicide (NiSi)), which will permit by way of the remaining steps of the process the contact resistivity at the silicide, germanide or germanosilicide/channel interface to be tailored using an implanted impurity or impurities.

The process may be considered complete at this point with the metal silicide, germanide or germanosilicide source and drain regions (electrical contacts) having been formed to the carbon-based channel. However, further tailoring of the contacts, for example, to configure the device as an n-channel FET or a p-channel FET, e.g., through the formation of a segregation region, may be desirable (see FIGS. 19 and 20, described below).

Figure 19:
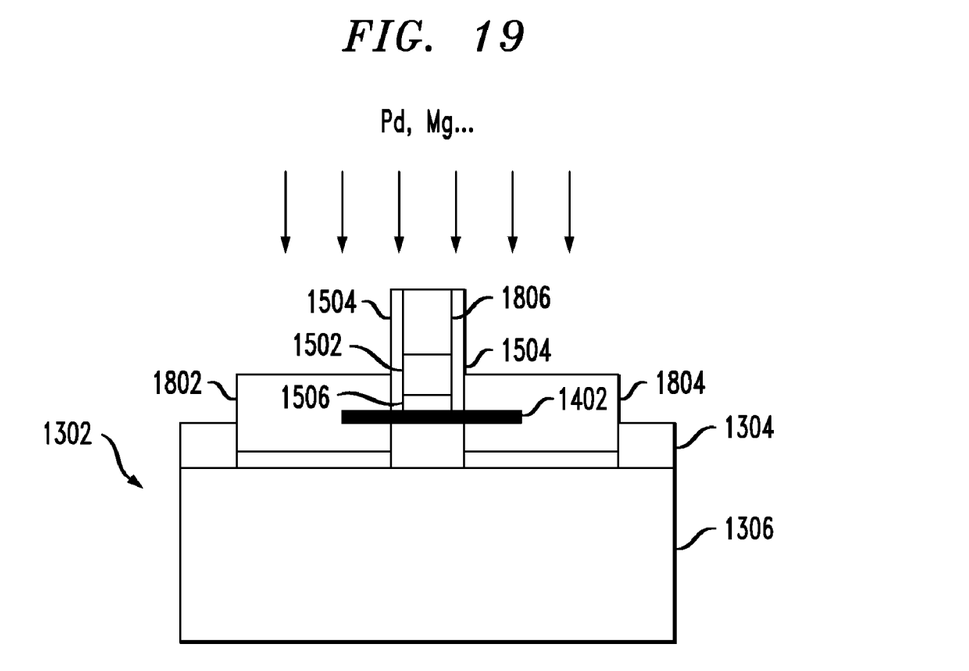
FIG. 19 is a cross-sectional diagram illustrating one or more impurities being implanted into the silicide, germanide or germanosilicide regions according to an embodiment of the present invention.

FIG. 19 is a cross-sectional diagram illustrating one or more impurities being implanted into regions 1802, 1804 and 1806. Since the impurity/impurities will be used to passivate the silicide, germanide or germanosilicide/channel interface (see below), the impurity/impurities should include an element that has a different work function than the respective silicide, germanide or germanosilicide (for example, a metal other than Ni with the suitable work function) and can make good contact with the carbon-based material of the channel. Suitable impurities that meet these criteria include, but are not limited to, metals such as Pd and/or Mg.

Figure 20:
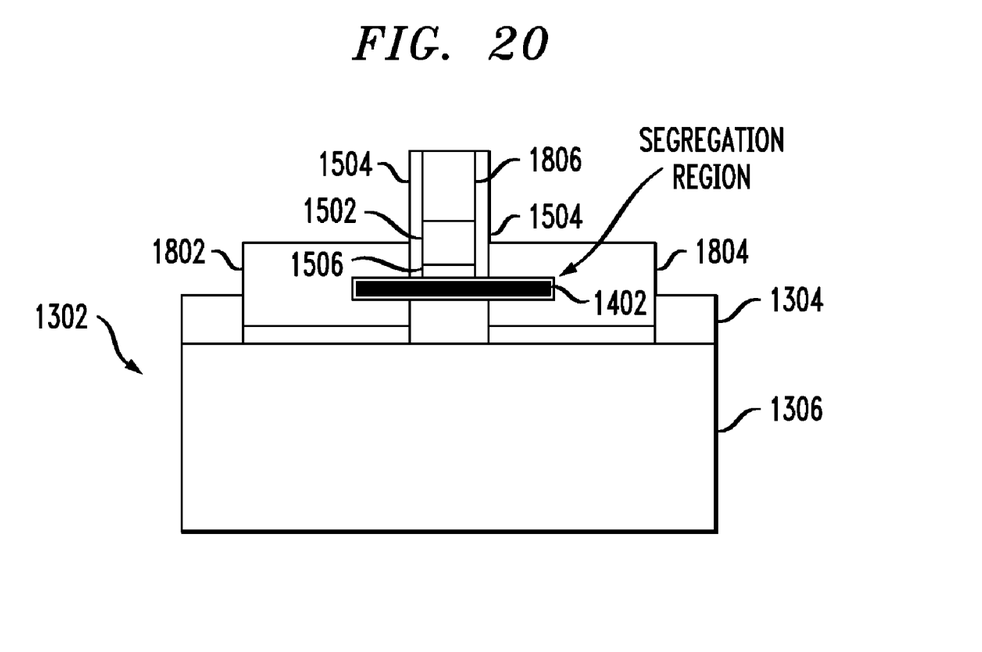
FIG. 20 is a cross-sectional diagram illustrating a segregation region having been formed between the channel and the (silicide, germanide or germanosilicide) source and drain regions according to an embodiment of the present invention.

FIG. 20 is a cross-sectional diagram illustrating a segregation region having been formed between channel 1402 and regions 1802 and 1804. The segregation region is formed by diffusing the implanted impurity/impurities (see FIG. 19, described above) to the silicide, germanide or germanosilicide/channel interface using a low temperature RTA (the temperature of which depends on the silicide, germanide or germanosilicide used, e.g., for Ni silicide temperatures of from about 400° C. to about 650° C., i.e., from about 500° C. to about 600° C., may be employed, see above). As a result, the work function of the impurities in the segregation region is used to modify the Schottky barrier of the contact to be close to zero (i.e., less than about 100 meV), or negative. Namely, the segregation region will serve to passivate the silicide, germanide or germanosilicide/channel interface. Thus, through the process described herein, the contact resistivity at the silicide, germanide or germanosilicide/channel interface can be tailored based on the particular impurity or impurities used to form the segregation region.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A device, comprising:
 a carbon-based material;
 at least one electrical contact to the carbon-based material comprising a metal silicide, germanide or germanosilicide; and
 at least one segregation region, comprising an impurity, separating the carbon-based material from the metal silicide, germanide or germanosilicide, wherein the impurity has a work function that is different from a work function of the metal silicide, germanide or germanosilicide.

2. The device of claim 1, wherein the carbon-based material contains at least 90 percent carbon.

3. The device of claim 1, wherein the carbon-based material contains at least 50 percent carbon.

4. The device of claim 1, wherein the carbon-based material comprises graphene or carbon nano-tubes.

5. The device of claim 1, comprising:
 a first electrical contact to the carbon-based material comprising a first metal silicide, germanide or germanosilicide and a second electrical metal contact to the carbon-based material comprising a second metal silicide, germanide or germanosilicide.

6. The device of claim 5, wherein the first metal silicide, germanide or germanosilicide comprises a different metal from the second metal silicide, germanide or germanosilicide.

7. The device of claim 5, wherein the first metal silicide, germanide or germanosilicide comprises a same metal as the second metal silicide, germanide or germanosilicide.

8. The device of claim 5, wherein the first electrical contact and the second electrical contact to the carbon-based material each comprises nickel silicide.

9. The device of claim 5, further comprising:
 a first segregation region, comprising a first impurity, separating the carbon-based material from the first metal silicide, germanide or germanosilicide and a second segregation region, comprising a second impurity, separating the carbon-based material from the second metal silicide, germanide or germanosilicide,
 wherein the first impurity has a work function that is different from a work function of the first metal silicide, germanide or germanosilicide and the second impurity has a work function that is different from a work function of the second metal silicide, germanide or germanosilicide.

10. The device of claim 9, wherein the first impurity and the second impurity each comprise one or more of palladium and magnesium.

11. The device of claim 5, wherein the device is an n-channel field-effect transistor (NFET) or a p-channel field-effect transistor (PFET), and wherein the device further comprises:
a gate stack formed over a portion of the carbon-based material.

12. The device of claim 11, wherein the portion of the carbon-based material over which the gate stack is formed serves as a channel of the device, and wherein the first electrical contact serves as a source region of the device and the second electrical contact serves as a drain region of the device.

13. The device of claim 11, wherein the first metal silicide, germanide or germanosilicide and the second metal silicide, germanide or germanosilicide are aligned with edges of the gate stack.

14. A method for fabricating a device, comprising the steps of:
providing a carbon-based material;
forming at least one electrical contact to the carbon-based material comprising a metal silicide, germanide or germanosilicide; and
forming at least one segregation region, comprising an impurity, separating the carbon-based material from the metal silicide, germanide or germanosilicide, wherein the impurity has a work function that is different from a work function of the metal silicide, germanide or germanosilicide.

15. The method of claim 14, wherein the metal silicide, germanide or germanosilicide is formed using a self-aligning process, and wherein the step of forming the at least one electrical contact further comprises the steps of:
forming an epitaxial region over the carbon-based material;
depositing a metal over the epitaxial region; and
annealing the device to intersperse the metal within the epitaxial region to form the metal silicide, germanide or germanosilicide.

16. The method of claim 14, wherein the step of forming the at least one electrical contact further comprises the steps of:
forming an epitaxial region over the carbon-based material;
depositing a metal over the device;
patterning the metal through a mask to remove the metal from all but an area over the epitaxial region; and
annealing the device to intersperse the metal within the epitaxial region to form the metal silicide, germanide or germanosilicide.

17. The method of claim 14, wherein the step of forming the segregation region further comprises the steps of:
implanting the impurity into the metal silicide, germanide or germanosilicide; and
diffusing the impurity to an interface between the metal silicide, germanide or germanosilicide and the carbon-based material to form the segregation region.

18. The method of claim 14, further comprising the steps step of:
providing an oxidized substrate comprising a silicon dioxide layer over a silicon wafer; and
forming the carbon-based material over the oxidized substrate.

19. The method of claim 18, further comprising the step of:
selectively removing portions of the silicon dioxide layer to expose portions of the silicon wafer thereunder.

20. The method of claim 14, further comprising the steps of:
providing a bulk silicon wafer;
patterning trenches into the wafer;
filling the trenches with a dielectric material; and
forming the carbon-based material over one of the trenches.

21. The method of claim 14, further comprising the step of:
forming a first electrical contact to the carbon-based material comprising a first metal silicide, germanide or germanosilicide and a second electrical contact to the carbon-based material comprising a second metal silicide, germanide or germanosilicide.

22. The method of claim 21, further comprising the step of:
forming a first segregation region, comprising a first impurity, separating the carbon-based material from the first metal silicide, germanide or germanosilicide and a second segregation region, comprising a second impurity, separating the carbon-based material from the second metal silicide, germanide or germanosilicide, wherein the first impurity has a work function that is different from a work function of the first metal silicide, germanide or germanosilicide and the second impurity has a work function that is different from a work function of the second metal silicide, germanide or germanosilicide.

23. The method of claim 21, wherein the device is an NFET or a PFET, and wherein the method further comprises the step of:
forming a gate stack over a portion of the carbon-based material.

* * * * *